United States Patent
Batz, Jr. et al.

(10) Patent No.: US 6,602,383 B1
(45) Date of Patent: Aug. 5, 2003

(54) APPARATUS AND METHODS FOR CONTROLLING WORKPIECE SURFACE EXPOSURE TO PROCESSING LIQUIDS DURING THE FABRICATION OF MICROELECTRONIC COMPONENTS

(75) Inventors: Robert W. Batz, Jr., Kalispell, MT (US); Reed A. Blackburn, Whitefish, MT (US); Steven E. Kelly, Richland, WA (US); James W. Doolittle, Whitefish, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/386,200

(22) Filed: Aug. 31, 1999

Related U.S. Application Data

(63) Continuation of application No. PCT/US98/20743, filed on Sep. 30, 1998.

(51) Int. Cl.[7] .............................................. H01L 21/00
(52) U.S. Cl. ............................ 156/345.15; 156/345.23; 204/286; 204/400; 438/8; 438/745
(58) Field of Search ....................... 156/345 LC, 345 L, 156/345.13, 345.14, 345.15, 345.23; 438/8, 745; 205/81, 273, 335; 118/668; 204/194, 285, 286, 400

(56) References Cited

U.S. PATENT DOCUMENTS 5,573,624 A * 11/1996 Barbee et al. ............... 156/345

* cited by examiner

Primary Examiner—William A. Powell
(74) Attorney, Agent, or Firm—Perkins Coie LLP

(57) ABSTRACT

An apparatus for use in processing a workpiece to fabricate a microelectronic component is set forth. The apparatus comprises a process container having a process fluid therein for processing the workpiece and a workpiece holder configured to hold the workpiece. A position sensor is employed to provide position information indicative of the spacing between a surface of the workpiece and a surface of the process fluid. A drive system provides relative movement between the surface of the workpiece and the surface of the process fluid in response to the position information. Preferably, the relative movement provided by the drive system comprises a first motion that causes the surface of the workpiece to contact the surface of the process fluid, and a second motion opposite the direction all of and following the first to generate and maintain a column of process fluid between the surface of the process fluid and the surface of the workpiece. In this manner, the drive system causes the surface of the workpiece to contact the surface of the process fluid to the exclusion of other surfaces of the workpiece thereby limiting processing of the workpiece to only the desired surface. In accordance with one embodiment, the apparatus is configured to electroplate a material onto the surface of the workpiece.

14 Claims, 6 Drawing Sheets

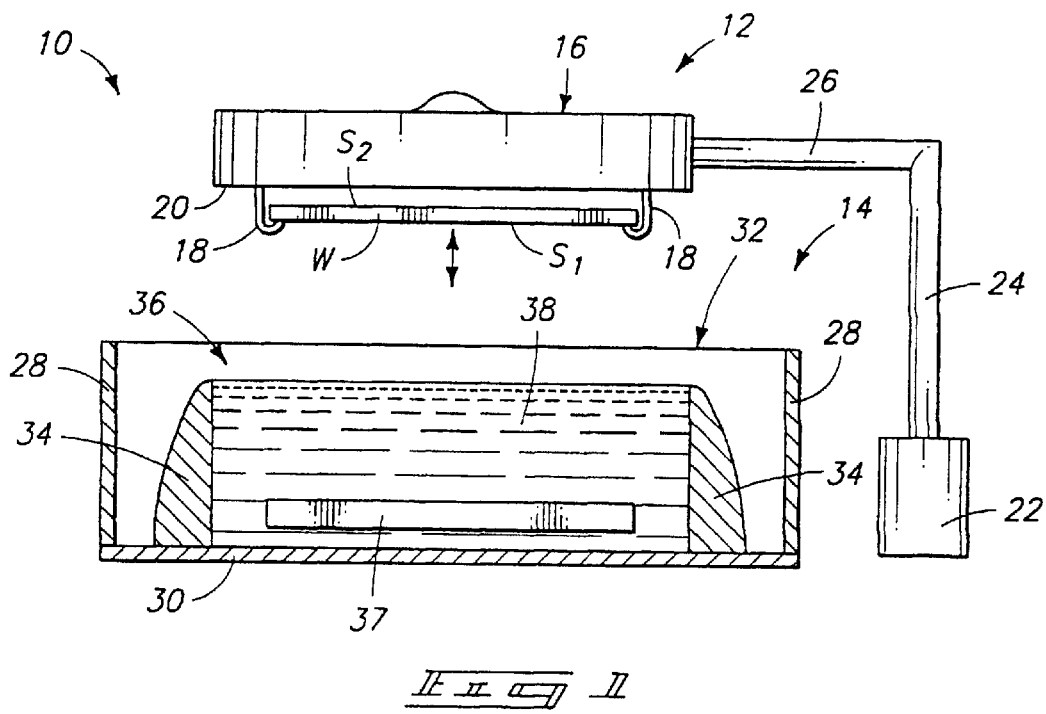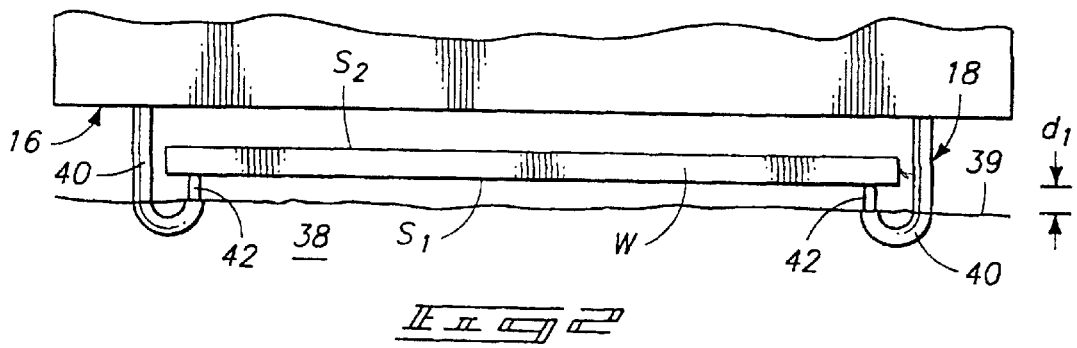

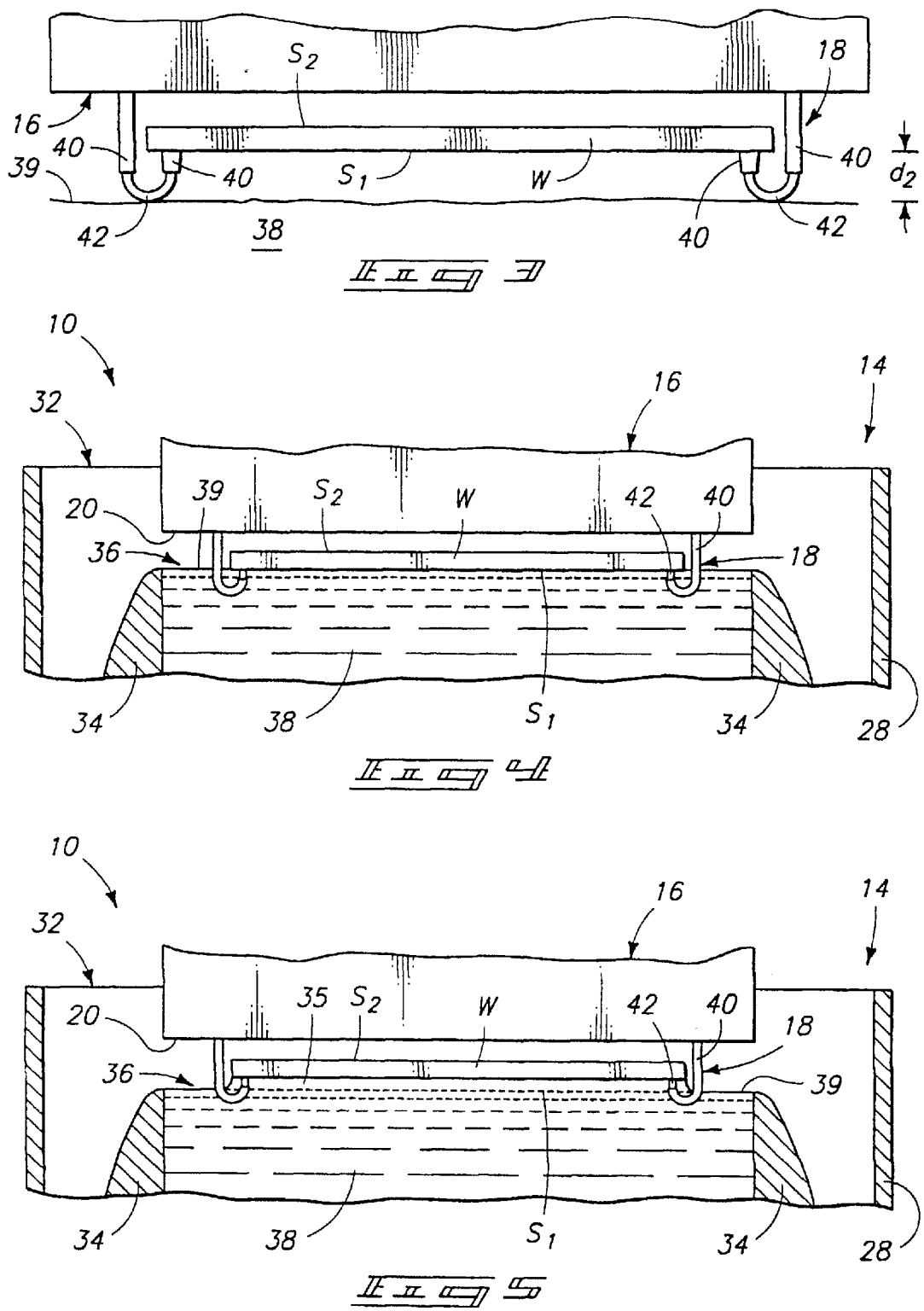

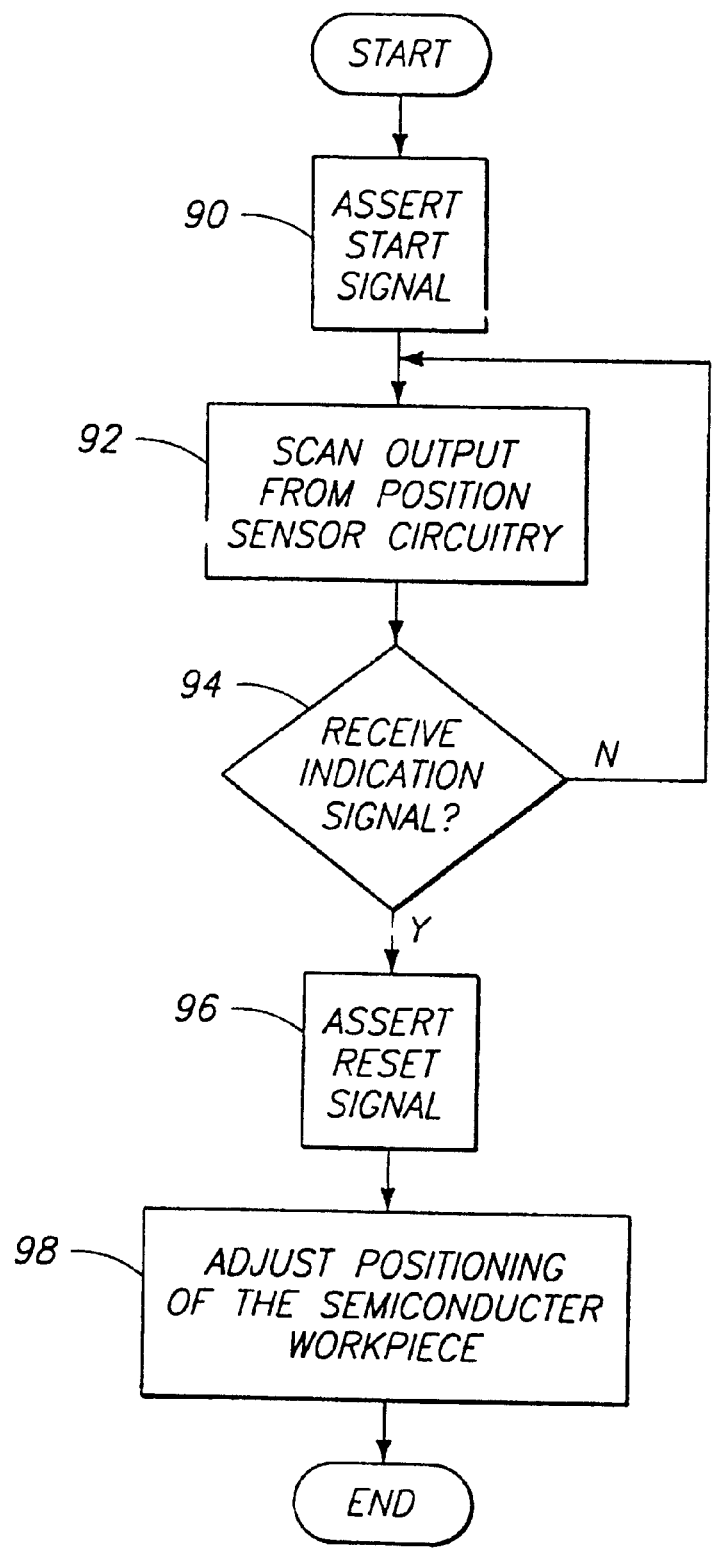

APPARATUS AND METHODS FOR CONTROLLING WORKPIECE SURFACE EXPOSURE TO PROCESSING LIQUIDS DURING THE FABRICATION OF MICROELECTRONIC COMPONENTS

CROSS-REFERENCE TO RELATED APPLICATIONS

This is a continuation application of International PCT Patent Application No. PCT/US98/20743, designating the US, filed Sep. 30, 1998, entitled APPARATUS AND METHOD FOR CONTROLLING WORKPIECE SURFACE EXPOSURE TO PROCESSING LIQUIDS DURING THE FABRICATION OF MICROELECTRONIC COMPONENTS, which claims priority from U.S. patent application Ser. No. 08/940,517, filed Sep. 30, 1997, and U.S. patent application Ser. No. 08/940,523, filed Sep. 30, 1997, now U.S. Pat. No. 6,015,462.

STATEMENT REGARDING FEDERALLY SPONSORED RESEARCH OR DEVELOPMENT

Not Applicable

BACKGROUND OF THE INVENTION

The fabrication of microelectronic components from a workpiece, such as a semiconductor wafer substrate, polymer substrate, etc., involves a substantial number of processes. Generally stated, there are four categories of processing operations performed on the workpiece to fabricate the microelectronic component(s). Such operations include material deposition, patterning, doping and heat treatment.

Material deposition processing involves depositing thin layers of electronic material to the surface of the workpiece (hereinafter described as, but not limited to, a semiconductor wafer). Patterning provides removal of selected portions of these added layers. Doping of the semiconductor wafer is the process of adding impurities known as "dopants" to the selected portions of the wafer to alter the electrical characteristics of the substrate material. Heat treatment of the semiconductor wafer involves heating and/or cooling the wafer to achieve specific process results.

Numerous processing devices, known as processing "tools", have been developed to implement the foregoing processing operations. These tools take on different configurations depending on the type of workpiece used in the fabrication process and the process or processes executed by the tool. One tool configuration, known as the Equinox(R) wet processing tool and available from Semitool, Inc., of Kalispell, Mont., includes one or more semiconductor workpiece processing stations that utilize a semiconductor workpiece holder and a process bowl or container for implementing wet processing operations. Such wet processing operations include electroplating, etching, etc.

In accordance with one configuration of the foregoing Equinox(R) tool, the workpiece holder and the process bowl are disposed proximate one another and function to bring the semiconductor wafer held by the workpiece holder into contact with a processing fluid disposed in the process bowl. Restricting the processing fluid to the appropriate portions of the semiconductor wafer, however, is often problematic.

Conventional semiconductor workpiece processors have utilized various techniques to facilitate complete exposure of these appropriate portions to the processing fluid while concurrently shielding the remaining portions of the semiconductor wafer that are not to be contacted. For example, such conventional systems may require application of tape to the back side of the semiconductor wafer to prevent process fluid from contacting the portions of the wafer beneath the tape. Other configurations use a suction cup arrangement for contacting and holding to the back side of the semiconductor wafer to thereby prevent the processing fluid from contacting the back side.

Although such conventional techniques often adequately fulfill the purpose of preventing process fluid from coming in contact with the back surface of the semiconductor wafer, such techniques present their own set of problems. For example, additional processing steps are required to apply the tape. Further, additional parts are required when a physical cover is used to prevent processing fluid contact with the back side of the workpiece. Still further, semiconductor workpieces are fragile and care must be taken not to damage the wafer during covering of the wafer surface. The increased wafer handling inherent in the conventional techniques increases the risk of wafer damage.

Therefore, the present inventors have recognized a need to improve on the techniques currently used to control the contact between the processing fluid and the appropriate portions of the semiconductor workpiece.

BRIEF DESCRIPTION OF THE DRAWINGS

Preferred embodiments of the invention are described below with reference to the following accompanying drawings.

FIG. 1 is a schematic representation of a process module of a semiconductor workpiece processor.

FIG. 2 is a side view of a first embodiment of a process head of the process module holding a semiconductor workpiece.

FIG. 3 is a side view, similar to FIG. 2, of a second embodiment of a process head of the process module.

FIG. 4 is a side view of the process head of FIG. 2 positioning a semiconductor workpiece in contact with a process fluid within a process container of the process module.

FIG. 5 is a side view illustrating the formation of a column of process fluid intermediate the semiconductor workpiece and the process fluid bath.

FIG. 10 is a flow chart illustrating a method of monitoring and controlling the position of a semiconductor workpiece.

SUMMARY OF THE INVENTION

Figure 6:
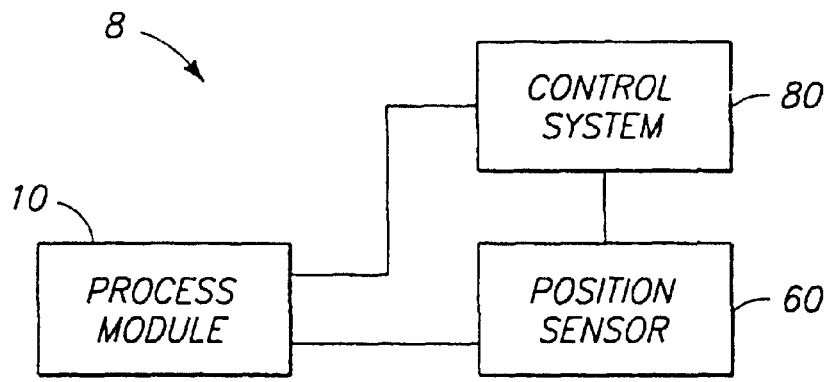
FIG. 6 is a functional block diagram illustrating various components according to one embodiment of the semiconductor workpiece processor.

An apparatus for use in processing a workpiece to fabricate a microelectronic component is set forth. The apparatus comprises a process container having a process fluid therein for processing the workpiece and a workpiece holder configured to hold the workpiece. A position sensor is employed to provide position information indicative of the spacing between a surface of the workpiece and a surface of the process fluid. A drive system provides relative movement between the surface of the workpiece and the surface of the process fluid in response to the position information. Preferably, the relative movement provided by the drive system comprises a first motion that causes the surface of the workpiece to contact the surface of the process fluid, and a second motion opposite the direction all of and following the first to generate and maintain a column of process fluid between the surface of the process fluid and the surface of the workpiece. In this manner, the drive system causes the surface of the workpiece to contact the surface of the process fluid to the exclusion of other surfaces of the workpiece thereby limiting processing of the workpiece to only the desired surface. In accordance with one embodiment, the apparatus is configured to electroplate a material onto the surface of the workpiece.

DETAILED DESCRIPTION OF THE PREFERRED EMBODIMENTS

FIG. 1 illustrates one embodiment of a semiconductor workpiece processor 10. In this embodiment, the processor 10 includes a semiconductor processing head 12 and a process container or bowl 14. The processing head 12 includes one or more components that are adapted to support a semiconductor workpiece W, such as a semiconductor wafer. The semiconductor wafer W has a first or lower surface $S_1$ and a second or upper surface $S_2$.

In the illustrated embodiment, the processing head 12 includes a workpiece holder 16. The workpiece holder 16 of the illustrated embodiment includes fingers or supports 18 coupled with a lower surface 20 thereof. Fingers 18 of holder 16 are configured to support a semiconductor workpiece W adjacent a lower surface 20 of head 12. In the disclosed embodiment, workpiece holder 16 is configured to support semiconductor workpiece W so that the lower surface $S_1$ thereof is presented for contact with a processing fluid or bath disposed in the process cup. Process head 12 may include a rotor motor or the like that is configured to rotate or spin the holder 16 and the semiconductor workpiece W held thereby. Such rotation of workpiece W may occur during processing of the workpiece when it is in contact with the processing fluid, or when the workpiece W is removed from such contact.

Workpiece holder 16 is configured for vertical movement with respect to process bowl 14. More specifically, a vertical drive motor 22 is provided to implement vertical movement of process head 12, workpiece holder 16 being in fixed vertical relationship with the process head 12 and resulting in concurrent movement thereof. In the configuration shown in FIG. 1, vertical drive motor 22 is coupled with a vertically oriented shaft 24 that, in turn, is coupled with a horizontal supporting member 26. Support member 26 is joined at a first end thereof with vertical shaft 24. A second end of support member 26 engages and supports process head 12.

Movement of vertical shaft 24 in either an upward or downward direction provides corresponding movement of head 12, and the workpiece holder 16 fixed thereto, upward or downward with respect to process bowl 14. In particular, vertical drive motor 22 is configured to lower head 12 to a position in which semiconductor workpiece W is in contact with process solution or fluid 38 within process bowl 14. Typically, the process fluid 38 is a liquid bath, such as an electroplating bath.

Contact between the semiconductor workpiece W and the process fluid 38 results in the processing of preselected portions, such as the lower surface $S_1$, of the exposed surface of semiconductor workpiece W. The processing may include electroless plating, electroplating or etching processes. In the illustrated embodiment, processing head 12 is preferably configured to rotate about a horizontal axis to facilitate engagement and extraction of the semiconductor workpieces W to and from the workpiece holder 16. For example, head 12 may be configured to rotate about an axis defined by support member 26. Semiconductor workpieces W may be engaged with holder 16 or removed therefrom when head 12 is rotated to a position in which holder 16 is face-up (not shown).

Various details of one embodiment of process bowl 14 are illustrated in the cross-sectional views of FIGS. 1, 4 and 5. As illustrated, process bowl 14 of processor 10 includes sidewalls 28 and a lower wall 30 that together defined defining a process compartment 32. Sidewalls 28 are annular in the described embodiment to define a substantially circular process compartment 32 within bowl 14.

A ring 34 is provided within process compartment 32. Ring 34 is spaced apart from sidewalls 28 and defines an annularly-shaped compartment 36 therebetween. Ring 34 is operable to receive and contain the process fluid 38, such as a plating bath, within fluid compartment 36. Further, the upper portion of ring 34 forms a weir that maintains the level of process fluid 38 at a substantially constant level. In one embodiment, a flow of process fluid 38 is provided to the processing bowl 14 to generate an upwardly directed flow that spills over ring 34 to insure that process fluid 38 that ultimately contacts the wafer is fresh (e.g., in the case of electroplating, it insures that the requisite concentration of the metal that is to be plated is present at the surface to be plated).

The illustrated process bowl 14, processing head 12, and workpiece holder 16 of processor 10 are exemplary configurations only. Other configurations of process module 10 are considered and within the scope of the present invention.

In the illustrated embodiment, the processor 10 is configured for electroplating. To this end, an anode 37 is provided within the fluid compartment 36 of process container 14 while the semiconductor workpiece W constitutes the cathode. As described in further detail below, the fingers 18 may be constructed as electrodes that conduct the requisite electroplating power to the surface S1 of semiconductor workpiece W for the plating operation. Both the anode 37 and cathode of processor 10 are coupled with a plating power supply 15 (shown in FIG. 8).

As previously mentioned, some semiconductor workpiece processing methods, such as the electroplating operations described herein, require processing of only selected portions (e.g., a single side) of a given semiconductor workpiece W. In such situations, the other portions (e.g., upper side $S_2$) must be shielded to prevent contact with the process fluid.

Processor 10 is designed to provide such selective contact between the semiconductor workpiece W and the process fluid 38, such as an electroplating bath. More particularly, in the preferred embodiment disclosed herein, processor 10 is adapted to allow processing of the lower surface $S_1$ of semiconductor workpiece W while inhibiting processing of the upper surface $S_2$. During this mode of operation, the upper surface $S_2$ and, in some instances, even the edges of the semiconductor workpiece W are prevented from contacting the process fluid 38.

To this end, as will be explained in further detail below, processor 10 is operated to provide controlled relative vertical movement between the processing head 12 and the surface of the processing fluid 38 until surface $S_1$ of semiconductor workpiece W first contacts the fluid. In the illustrated embodiment, it is the processing head 12 that is moved vertically to provide such contact while the process bowl 14 remains fixed. After contact between the surface $S_1$ and the surface of the fluid 38 is established, the surface $S_1$ is pulled vertically in a direction away from fluid 38 by a small, predetermined distance. The surface tension of the fluid 38 results in a meniscus whereby the processing fluid 38 is prevented from contact with the upper surface $S_2$ and, in most instances, the peripheral edges of the workpiece W.

Preferably, this controlled vertical motion is responsive, at least in part, to one or more signals indicative of the real-time position of the surface $S_1$ with respect to the surface of the fluid 38. In the illustrated embodiment, one or more conductors are disposed in fixed relation with the head 12. These conductors may be disposed to contact the fluid 38 at different vertical positions along the vertical movement path of the head 12 toward and away from the surface of fluid 38. As such, contact between a particular conductor or electrode and the surface of fluid 38 corresponds to a given distance between the semiconductor workpiece W and fluid 38. Multiple relative distances may be sensed by employing multiple conductors disposed to contact fluid 38 at different vertical positions along the vertical movement path.

Various electronic techniques may be used to sense contact between a particular conductor and fluid 38. Where, as here, the processor 10 is configured for electroplating, it is possible to take advantage of the conductivity of the electroplating solution, designated as fluid 38, so as to minimize the number of additional components required to implement the position sensing. To this end, a reference voltage is generated between the conductor and anode 37. When a given conductor contacts the electroplating solution, electrical continuity is established in an electrical circuit that comprises the conductor, anode, and process fluid 38. This continuity condition can be detected and used as an indicator of contact between a given conductor and the surface of the electroplating solution.

In the illustrated embodiment, fingers 18 perform dual functions. First, fingers 18 are constructed to provide plating power to the surface $S_1$ of semiconductor workpiece W. Second, fingers 18 are used as conductors/sensors that assist in providing an indication of the position of semiconductor workpiece W relative to process fluid 38.

Each finger 18 shown in FIG. 2 comprises a centrally disposed conductive material that is used to receive and conduct an electric signal in the manner described above, and a dielectric coating 40 disposed about selected portions of the conductive material. As illustrated, the dielectric coating 40 only covers a portion of the centrally disposed conductive material thereby providing exposed conductors 42.

As workpiece holder 16 is lowered toward process bowl 14, the exposed conductors 42 of the fingers 18 contact process fluid 38. Contact between the exposed conductors 42 and fluid 38 (e.g., a conductive electroplating solution) completes an electrical circuit. With reference to FIG. 2, this continuity condition first occurs when the surface $S_1$ is a distance $d_1$ from the surface of fluid 38. As such, it becomes possible to determine when the surface $S_1$ and the surface of fluid 38 are a predetermined distance $d_1$ apart, in effect monitoring the vertical position of the surface $S_1$ with respect to the surface of fluid 38.

Sensing of the relative position depends upon the positioning of the exposed portions of conductors 42 within fingers 18 relative to the surface $S_1$. As shown in FIG. 2, conductors 42 are brought into contact with process fluid 38 corresponding to a distance $d_1$ intermediate lower surface $S_1$ of workpiece W and a surface or meniscus 39 of process fluid 38. With reference to FIG. 3, however, the dielectric 40 of the fingers 18 exposes exposed conductors 42 so that a measurable current flow (or other reference signal) is first generated wine the surface $S_1$ and meniscus 39 are spaced from one another by a distance $d_2$. Exposing different portions of conductors 42 enables sensing of the position of semiconductor workpiece W with respect to process fluid 38 at various positions along the vertical movement path.

Referring to FIG. 4, the embodiment of workpiece holder 16 shown in FIG. 2 has been lowered a sufficient extent to submerge the lower portions of fingers 18 within process fluid 38 and place the surface $S_1$ into contact with the meniscus 39. Preferably, for example, workpiece holder 16 has been lowered a distance $d_1$ from the position shown in FIG. 2 after the reference signal indicative of spacing $d_1$ is first detected. The lower surface $S_1$ of workpiece W is thus wetted with process solution 38 in the position shown in FIG. 4. Semiconductor workpiece W may be held at the position shown in FIG. 4 to provide processing of the lower surface $S_1$ thereof while preventing contact of the fluid 38 with the upper surface $S_2$.

In some instances, it may be desirable to further limit the extent of contact between the processing fluid 38 and semiconductor workpiece W. This may be accomplished in the manner illustrated in FIG. 5, which shows that process head 16 has been raised a predetermined distance (possibly, a programmable distance) following contacting of lower surface $S_1$ of semiconductor workpiece W with surface 39 of process fluid 38. By raising the process head 16 in this manner, a column 35 of process fluid 39 is provided between the lower surface $S_1$ of semiconductor workpiece W and the remaining process fluid 38 within fluid compartment 36. The column 35 of process fluid 39 may be a few millimeters in height. For example, column 35 may have a height within a range of approximately zero millimeters to five millimeters, and typically within a range of one to three millimeters.

Such raising of semiconductor workpiece W minimizes the likelihood that process fluid 38 will splash onto the upper surface $S_2$ thereof. Further, such raising assists in preventing the process fluid 38 from contacting peripheral edge portions of the semiconductor workpiece W. The positioning of semiconductor workpiece W with respect to process fluid 38 may vary and is dependent upon the specific type of plating coverage or other processing desired.

In the illustrated embodiment, the reference signal (here, present only when an electrical circuit is established comprising the exposed conductor 42, the process fluid 38, and anode 37) is applied to position sensor circuitry 60 (FIG. 6). Position sensor 60 is configured to generate a position indication signal responsive to the reference signal. The position indication signal may be applied to a control system 80 of the semiconductor workpiece processor 10. Control system 80 is responsive to the position indication signal to control the vertical drive motor 22 thereby providing controlled movement of process head 16 and semiconductor workpiece W relative to process fluid 38.

Referring to FIG. 6, one configuration of a semiconductor workpiece processor 8 is shown in a block diagram. The illustrated workpiece processor 8 includes a control system 80, process module 10 and position sensor 60. Control system 80 is electrically coupled with position sensor circuitry 60 and process module 10.

Figure 7:
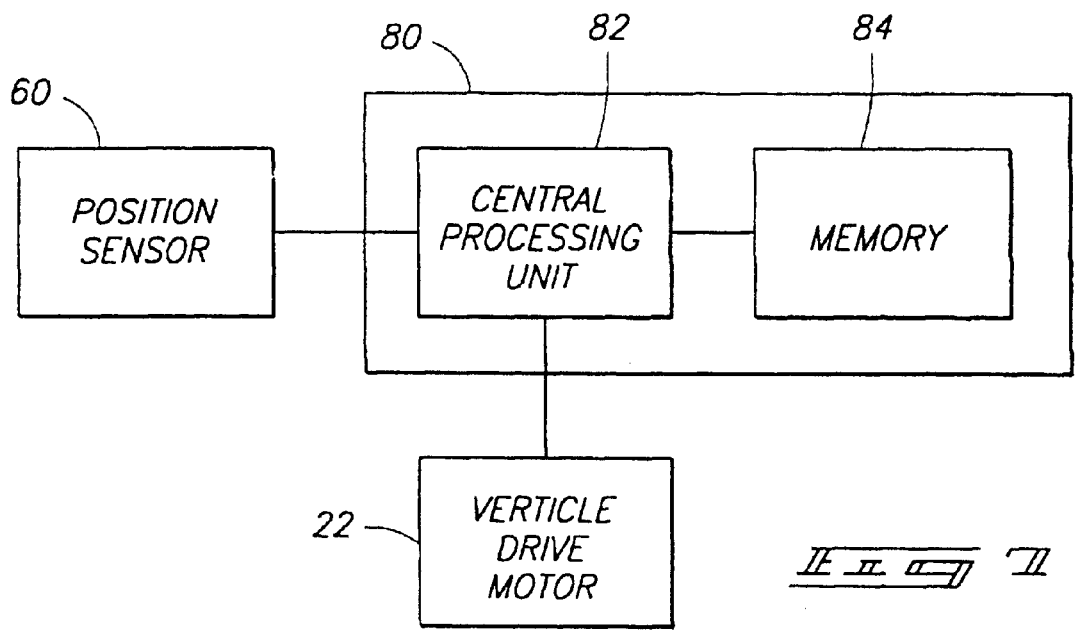
FIG. 7 is a functional block diagram of an embodiment of a control system of the semiconductor workpiece processor.

One embodiment of the control system 80 is shown in FIG. 7. As illustrated, control system 80 comprises at least a central processing unit 82 (CPU) and a memory device 84. Central processing unit 82 is operable to interface with memory device 84. Memory 84 may implemented as either RAM or ROM or both and is configured to store operational code described below with respect to the flow chart of FIG. 10. The central processing unit 82 of control system 80 is configured via the operational code to receive position information from position sensor 60 and control vertical drive motor 22 and the positioning of semiconductor workpiece W responsive thereto.

Figure 8:
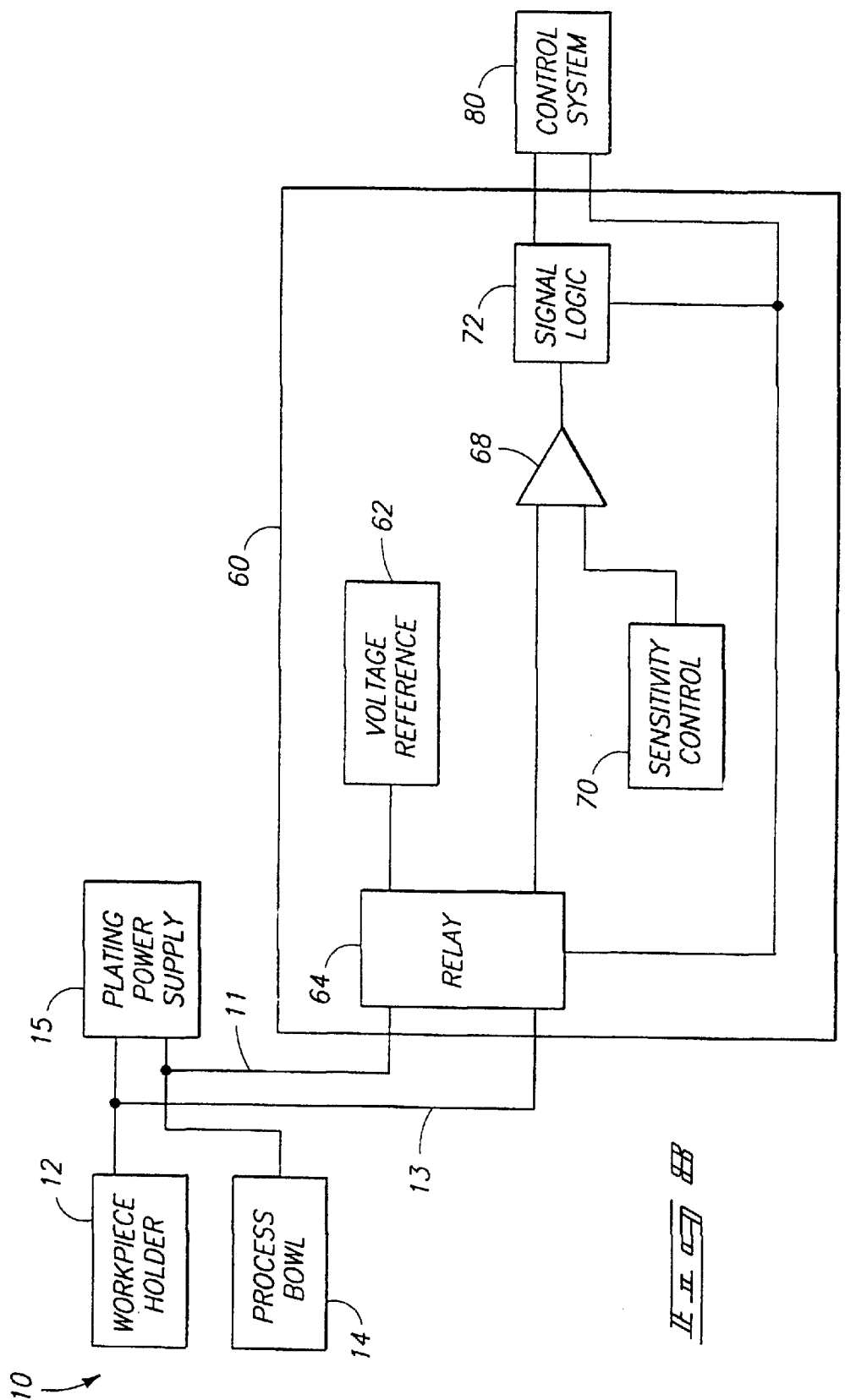
FIG. 8 is a functional block diagram of an embodiment of position sensor circuitry of the semiconductor workpiece processor.

Referring to FIG. 8, one embodiment of position sensor 60 is shown. The illustrated position sensor 60 includes a voltage reference 62, relay 64, comparator 68, sensitivity control circuitry 70, and signal logic circuitry 72. The relay 64 is coupled with the anode 37 of process bowl 14 and the fingers 18 of workpiece holder 12 of process module 10, as well as plating power supply 15. The signal logic 72 and relay 64 of position sensor 60 are coupled with the control system 80 of the semiconductor workpiece processor 8.

In general, position sensor 60 generates and outputs a signal indicative of the vertical distance between surface $S_1$ and meniscus 39. In the illustrated embodiment, a binary signal is generated to the control system 80. This signal transitions from a logical "false" to a logical "true" when a predetermined distance between surface $S_1$ and meniscus 39 is first reached.

The position sensor 60 includes a voltage reference 62 that operates as a reference signal generator. The reference signal generated by voltage reference 62 is preferably a low voltage, low current electric signal. In the described embodiment, the reference signal is one volt and approximately two milliamps.

The reference signal is selectively applied to processor 10 responsive to control signals from control system 80. Upon start-up and prior to processing of a semiconductor workpiece W, control system 80 applies an appropriate control signal to relay circuit 64. Relay circuit 64 is energized responsive to receiving the control signal and applies the reference signal to the anode in process bowl 14 and to the fingers 18 via electrical connection lines 11 and 13, respectively.

When the surface $S_1$ of semiconductor workpiece W reaches a predetermined distance, such as $d_1$ of FIG. 2, from meniscus 39 of process fluid 38, the reference signal applied via line 11 is electrically connected through fingers 18 and the fluid 38 to anode 37. This signal is provided from the relay circuitry 64 to an input of comparator 68. The comparator circuit 68 compares the magnitude of the signal to a predetermined threshold value that is provided at the output of sensitivity control 70. If the magnitude of the detected signal exceeds the threshold value, comparator 68 generates a signal to the input of signal logic 72 which, in turn, provides a logical "true" signal to control system 80. (It will be recognized that signal logic circuit 72 may be unnecessary when the output signal from compared are 68 transitions between binary states that may be recognized by the control system.) Adjusting sensitivity control 70 adjusts the threshold value and, in turn, the trip point for comparator 68. Sensitivity control 70 comprises a potentiometer in accordance with one embodiment of the invention.

Signal logic 72 is preferably configured to store the logical binary value corresponding to the signal from the output of compared are 68. Further, the signal logic 72 may generate a signal to the relay 64 that de-energizes the relay 64 when the stored signal is a logical "true". Such de-energization of relay 64 insulates position sensor circuitry 60 from electrical connection lines 11, 13 and effectively replaces the reference signal with electroplating power provided at the output of plating power supply 15. In this de-energized state, plating power supply 15 is operable to apply a high voltage and/or current across electrical connection lines 11, 13 and the anode and cathode of process module 10 responsive to control from central processing unit 82. De-energizing relay 64 also protects position sensor circuitry 60 from the high voltages and/or currents generated by the power supply 15. Once relay 64 has been de-energized, central processing unit 82 preferably generates one or more signals that are used to turn on plating power supply 15 to conduct electroplating of the semiconductor workpiece W.

Figure 9:
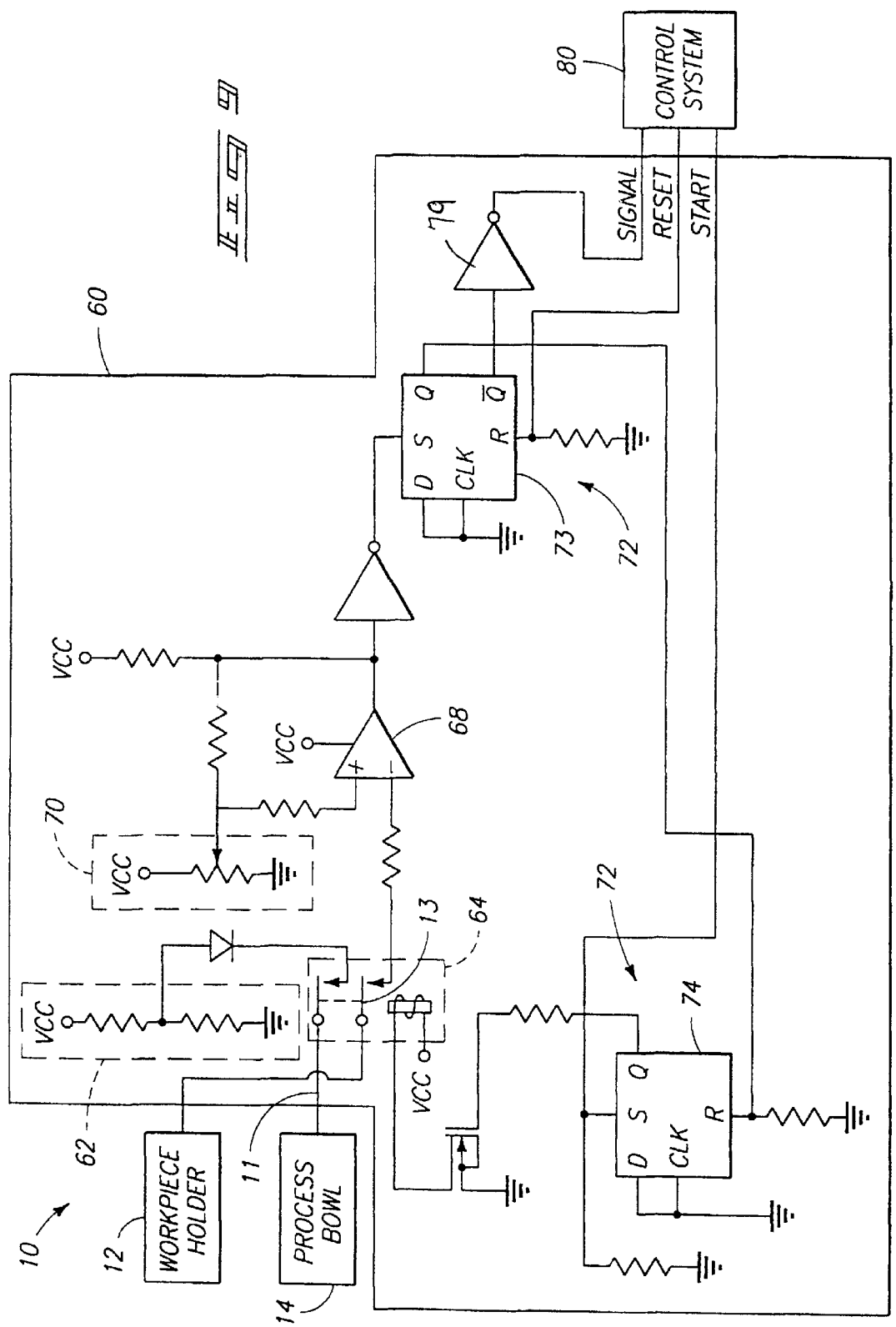
FIG. 9 is a schematic diagram of the position sensor circuitry shown in FIG. 8.

Referring to FIG. 9, a detailed schematic of position sensor circuitry 60 described above is shown. The illustrated position sensor 60 includes voltage reference 62, comparator 68, sensitivity control 70, and latches 73, 74. In the illustrated embodiment, signal logic 72 comprises latches 73, 74. Relay 64 is coupled with workpiece holder 12 via electrical connection line 13 and the anode 37 in process bowl 14 via electrical connection line 11. Control system 80 receives the signal output from latch 73 and is operable to apply a reset signal to latch 73 and a start signal to latch 74 at the appropriate times.

Responsive to the assertion of a start signal via control system 80, latch 74 is set. Setting latch 74 energizes relay 64 thereby coupling voltage reference 62 with the anode 37 of process bowl 14 via electrical connection 11. In addition, energizing relay 64 electrically couples the fingers 18 of workpiece holder 12 with comparator 68 via electrical connection 13.

The reference signal (minus small voltage drop across the fluid 38) is applied to comparator 68 upon contact between the process fluid 38 and exposed portions 42 of fingers 18 of process head 16. This results in a change in the state of the output signal of comparator 68. The state change sets latch 73 that, in turn, provides an output signal that resets latch 74.

Latch 73 and logic gate 79 operate to provide a signal indicative of the fact that the predetermined distance, such as $d_1$ of FIG. 2, has been reached and applies this signal to control system 80. Latch 73 effectively stores this signal state thereby enabling the central processing unit 82 of control system 80 to poll the signal according to timing of control system 80.

Once the central processing unit 82 of control system 80 detects a transition to a logical "true" the state from the position sensor 60, the central processing unit 82 provides a reset signal to clear latch 73. Thereafter, the central processing unit of the control system 80 reasserts the start signal to set latch 74 once a subsequent semiconductor workpiece W is properly positioned within process head 16 and prior to the lowering of the head 16 and semiconductor workpiece W toward process fluid 38 within process container 14.

As stated above, control system 80 is configured to monitor and detect the presence of the position indication signal from signal logic 72. The presence of a logical "true" state of the position indication signal provides position information of the semiconductor workpiece W with respect to process fluid 38. Responsive to receiving the position indication signal, control system 80 is configured to operate vertical drive motor 22 and adjust the vertical position of semiconductor workpiece W with respect to the process fluid 38. More specifically, control system 80 can be operated to instruct vertical drive motor 22 to move process head 16 and the semiconductor workpiece W held thereby the predetermined distance, such as $d_1$ of FIG. 2, to contact the process fluid 38. The particular distance moved is typically preselected and corresponds to the distance intermediate semiconductor workpiece W and the process fluid 38. The semiconductor workpiece W may be lowered following the reception of the indication signal to account for the distance between the lower surface $S_1$ of the semiconductor workpiece W and the process fluid 38 corresponding to the exposed portion of the electrode 42 within finger 18. The particular portions of conductors 42 which are exposed may be varied to adjust the calibration (i.e., distance between the workpiece W and process fluid 38 at the moment the reference signal passes through conductor 42). Alternatively, adjustments of calibration may be implemented by software.

Lowering and contacting the semiconductor workpiece W with process fluid 38 wets the lower surface $S_1$ thereof with the fluid 38. In one embodiment, the lowering of workpiece W results in the spreading of the meniscus 39 of process fluid 38 over the entire lower surface $S_1$ of the semiconductor workpiece W.

Responsive to receiving a logical "true" state of the position indication signal from position sensor 60, control system 80 knows the exact position of semiconductor workpiece W with respect to the surface 39 of process fluid 38. Subsequent movement of process head 16 and semiconductor workpiece W following the reception of the indication signal may be variable depending upon the particular application. For example, after the lower surface $S_1$ of the semiconductor workpiece W has been driven to contact the meniscus 39 of process fluid 38, control system 80 may operate the drive motor 22 to retract or raise the semiconductor workpiece W a predetermined distance to provide the column 35 of process fluid 39 between semiconductor workpiece W and the remaining process fluid 38 within fluid compartment 36. The lower surface $S_1$ of semiconductor workpiece W preferably remains wetted during the retraction of process head 16 and workpiece W. An adhesive force or tension overcomes the gravitational force and maintains the process fluid 38 in contact with the lower surface $S_1$ during retraction of the workpiece W thereby forming column 35. As noted above, the formed column 35 of process fluid 38 may be a few millimeters in height. The positioning of semiconductor workpiece W with respect to process fluid 38 may vary and is dependent upon the specific type of plating coverage desired.

FIG. 10 is a flowchart illustrating one manner of operating the control system 80. Central processing unit 82 is configured via software code stored in, for example, memory 84 according to the illustrated flow chart. The control operations described in the depicted flow chart may be implemented in hardware according to alternative embodiments of the invention.

As illustrated in FIG. 10, control system 80 asserts a start signal that step 90. The start signal is preferably asserted prior to the lowering of the semiconductor workpiece W toward the meniscus 39 of process fluid 38. Assertion of the start signal sets second latch 74 thereby electrically coupling position sensor 60 and process module 10 via relay 64.

At step 92, control are 80 scans or reads the output of first latch 73 of position sensor 60 according to timing of the control system 80 (e.g., at predetermined time intervals). Following the scanning, control system 80 analyzes the detected signal to determine whether it has gone to a logical "true" state. As noted above, die logical "true" state indicates that the lower surface $S_1$ of semiconductor workpiece W is a predetermined distance from surface 39 of process fluid 38. If the indication signal is not at a logical "true" state, control system 80 continues to scan the output of first latch 73 of signal logic 72 at predetermined time intervals.

The control system 80 proceeds to step 96 of FIG. 10 if the position indication signal goes to a logical "true" state. At that time, the control system asserts the reset signal at step 96 that clears the first latch 73. Thereafter, control system 80 proceeds to step 98 to adjust the vertical spacing between the semiconductor workpiece W and meniscus 39 of the process fluid 38. For example, referring to FIG. 2, semiconductor workpiece W may be lowered a distance $d_1$ at step 98 depending upon the calibration of the process module 10 corresponding to the distance between the lower surface $S_1$ and surface 39 of process fluid 38. Alternatively, semiconductor workpiece W may be lowered a distance $d_2$ at step 98 if the process head 16 shown in FIG. 3 and the fingers 18 associated therewith are utilized. The process described with reference to FIG. 10 may be repeated when a subsequent semiconductor workpiece W is to be processed.

Adjusting the positioning of semiconductor workpiece W relative to process fluid 38 preferably coats or wets the lower surface $S_1$ of the semiconductor workpiece with the process fluid 38. Processing of the semiconductor workpiece W in accordance with the described method eliminates the need for covering the edges or upper surface $S_2$ of the semiconductor workpiece inasmuch as process fluid 38 is not applied to the sides or upper surface of the workpiece.

In addition, the semiconductor workpiece W may be subsequently raised following the coating of the lower surface $S_1$ thereof. An attractive force draws the process fluid upward forming a column 35 of process fluid between the semiconductor workpiece W and the process fluid bath 38. Such raising of semiconductor workpiece W reduces the chance of exposure of the sides or edges and upper surface $S_2$ of workpiece W to the process fluid 38. The edges and upper surface $S_2$ of workpiece W preferably remain free of plating solution during the processing and unwanted plating or processing of various portions of workpiece W is minimized.

In compliance with the statute, the invention has been described in language more or less specific as to structural and methodical features. It is to be understood, however, that the invention is not limited to the specific features shown and described, since the apparatus herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An apparatus for use in processing a workpiece to fabricate a microelectronic component comprising:
    a process container having a process fluid therein for processing the workpiece;
    a workpiece holder configured to hold the workpiece;
    a position sensor configured to provide position information indicative of the spacing between a surface of the workpiece and a surface of the process fluid; and
    a drive system providing relative movement between the surface of the workpiece and the surface of the process fluid in response to the position information.

2. An apparatus as claimed in claim 1 wherein the process fluid is electrically conductive and wherein the position sensor comprises:
    a first electrode in fixed positional alignment with and at a distance from the surface of the workpiece;

a second electrode disposed at a fixed position in the process fluid; and a signal generator for generating a signal to the drive system in response to electrical continuity in an electrical circuit comprising the first and second electrodes and the process fluid.

3. An apparatus as claimed in claim 1 wherein the relative movement provided by the drive system causes the surface of the workpiece to contact the surface of the process fluid to the exclusion of other surfaces of the workpiece.

4. An apparatus as claimed in claim 1 wherein the relative movement provided by the drive system comprises:

a first motion that causes the surface of the workpiece to contact the surface of the process fluid; and a second motion, following the first motion, to generate and maintain a column of process fluid between the surface of the process fluid and the surface of the workpiece, the second motion being in a direction opposite the first motion.

5. An apparatus as claimed in claim 1 wherein the relative movement results in the generation and maintaining of a column of process fluid intermediate the process container and the surface of the workpiece.

6. An apparatus as claimed in claim 1 wherein the apparatus further comprises components for electroplating a material on the surface of the workpiece.

7. An apparatus as claimed in claim 6 wherein the components comprise:

an anode disposed in the process fluid;

one or more cathode contacts for electrically contacting the surface of the workpiece;

an electroplating solution as the process fluid; and a plating power supply connected to apply power between the anode and the one or more cathode contacts.

8. An apparatus as claimed in claim 3 wherein the apparatus further comprises components for electroplating a material on the surface of the workpiece.

9. An apparatus as claimed in claim 8 wherein the components comprise:

an anode disposed in the process fluid;

one or more cathode contacts for electrically contacting the surface of the workpiece;

an electroplating solution as the process fluid; and a plating power supply connected to apply power between the anode and the one or more cathode contacts.

10. An apparatus as claimed in claim 4 wherein the apparatus further comprises components for electroplating a material on the surface of the workpiece.

11. An apparatus as claimed in claim 10 wherein the components comprise:

an anode disposed in the process fluid;

one or more cathode contacts for electrically contacting the surface of the workpiece;

an electroplating solution as the process fluid; and a plating power supply connected to apply power between the anode and the one or more cathode contacts.

12. An apparatus as claimed in claim 5 wherein the apparatus further comprises components for electroplating a material on the surface of the workpiece.

13. An apparatus as claimed in claim 12 wherein the components comprise:

an anode disposed in the process fluid;

one or more cathode contacts for electrically contacting the surface of the workpiece;

an electroplating solution as the process fluid; and a plating power supply connected to apply power between the anode and the one or more cathode contacts.

14. An apparatus as claimed in claim 1 wherein the relative movement raises the workpiece a distance after the surface of the workpiece has contacted the process fluid to thereby generate and maintain an intermediate column of process fluid.

* * * * *

UNITED STATES PATENT AND TRADEMARK OFFICE
CERTIFICATE OF CORRECTION

PATENT NO. : 6,602,383 B1  Page 1 of 1
DATED : August 5, 2003
INVENTOR(S) : Batz, Jr. et al.

It is certified that error appears in the above-identified patent and that said Letters Patent is hereby corrected as shown below:

<u>Column 1,</u>
Line 27, "wotkpiece" should be -- workpiece --;

<u>Column 9,</u>
Line 65, "die" should be -- the --;

Signed and Sealed this

Ninth Day of December, 2003

JAMES E. ROGAN
*Director of the United States Patent and Trademark Office*